(12) United States Patent
Shinohara

(10) Patent No.: US 11,139,332 B2
(45) Date of Patent: *Oct. 5, 2021

(54) SOLID-STATE IMAGING DEVICE, MANUFACTURING METHOD THEREOF, AND ELECTRONIC APPARATUS

(71) Applicant: Sony Corporation, Tokyo (JP)

(72) Inventor: Takekazu Shinohara, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,786

(22) Filed: Jun. 8, 2020

(65) Prior Publication Data

US 2020/0303434 A1 Sep. 24, 2020

Related U.S. Application Data

(63) Continuation of application No. 16/255,747, filed on Jan. 23, 2019, now Pat. No. 10,680,029, which is a
(Continued)

(30) Foreign Application Priority Data

Aug. 9, 2010 (JP) ................................. 2010-179073

(51) Int. Cl.
*H04N 3/14* (2006.01)
*H04N 5/335* (2011.01)
(Continued)

(52) U.S. Cl.
CPC ...... *H01L 27/1464* (2013.01); *H01L 27/1463* (2013.01); *H01L 27/14605* (2013.01); *H01L 27/14623* (2013.01); *H01L 27/14636* (2013.01); *H01L 27/14641* (2013.01); *H01L 27/14643* (2013.01); *H01L 27/14645* (2013.01); *H01L 27/14685* (2013.01); *H01L 27/14689* (2013.01);
(Continued)

(58) Field of Classification Search
CPC .......... H04N 3/14; H04N 5/335; H04N 5/374; H01L 27/0251; H01L 27/04; H01L 27/1464; H01L 27/14605; H01L 27/14641; H01L 27/14645; H01L 27/1463; H01L 27/14636; H01L 27/14643; H01L 27/14689; H01L 27/14623; H01L 27/14685; H01L 27/14621; H01L 27/14627
See application file for complete search history.

(56) References Cited

U.S. PATENT DOCUMENTS 8,749,679 B2 * 6/2014 Shinohara ........... H01L 27/1464
348/300
9,337,230 B2 * 5/2016 Shinohara ......... H01L 27/14645
(Continued)

*Primary Examiner* — Kelly L Jerabek
(74) *Attorney, Agent, or Firm* — Sheridan Ross P.C.

(57) ABSTRACT

A solid-state imaging device having a backside illuminated structure, includes: a pixel region in which pixels each having a photoelectric conversion portion and a plurality of pixel transistors are arranged in a two-dimensional matrix; an element isolation region isolating the pixels which is provided in the pixel region and which includes a semiconductor layer provided in a trench by an epitaxial growth; and a light receiving surface at a rear surface side of a semiconductor substrate which is opposite to a multilayer wiring layer.

16 Claims, 13 Drawing Sheets

Related U.S. Application Data continuation of application No. 16/004,061, filed on Jun. 8, 2018, now Pat. No. 10,283,552, which is a continuation of application No. 15/653,027, filed on Jul. 18, 2017, now Pat. No. 10,026,772, which is a continuation of application No. 15/380,461, filed on Dec. 15, 2016, now Pat. No. 9,741,760, which is a continuation of application No. 15/065,437, filed on Mar. 9, 2016, now Pat. No. 9,564,467, which is a continuation of application No. 14/260,118, filed on Apr. 23, 2014, now Pat. No. 9,337,230, which is a continuation of application No. 13/196,127, filed on Aug. 2, 2011, now Pat. No. 8,749,679.

(51) Int. Cl.
*H01L 27/00* (2006.01)
*H01L 27/146* (2006.01)
*H04N 5/374* (2011.01)

(52) U.S. Cl.
CPC ....... *H04N 5/374* (2013.01); *H01L 27/14621* (2013.01); *H01L 27/14627* (2013.01)

(56) References Cited

U.S. PATENT DOCUMENTS

| | | | |
|---|---|---|---|
| 9,564,467 B2* | 2/2017 | Shinohara | H01L 27/1463 |
| 9,741,760 B2* | 8/2017 | Shinohara | H01L 27/1463 |
| 10,026,772 B2* | 7/2018 | Shinohara | H01L 27/14605 |
| 10,283,552 B2* | 5/2019 | Shinohara | H01L 27/1463 |
| 2003/0025160 A1* | 2/2003 | Suzuki | H01L 27/14623 257/347 |
| 2007/0057147 A1* | 3/2007 | Kim | H01L 27/14601 250/208.1 |
| 2007/0210395 A1* | 9/2007 | Maruyama | H01L 31/022466 257/431 |
| 2008/0230865 A1* | 9/2008 | Hong | H01L 27/14601 257/458 |
| 2008/0290382 A1* | 11/2008 | Hirota | H01L 27/14627 257/291 |
| 2009/0020796 A1* | 1/2009 | Furuichi | H01L 27/14687 257/294 |
| 2010/0002117 A1* | 1/2010 | Iwane | H04N 5/37457 348/308 |
| 2010/0207231 A1* | 8/2010 | Iwamoto | H01L 27/14625 257/461 |

\* cited by examiner

SOLID-STATE IMAGING DEVICE, MANUFACTURING METHOD THEREOF, AND ELECTRONIC APPARATUS

CROSS-REFERENCE TO RELATED APPLICATIONS

This application is a continuation of U.S. patent application Ser. No. 16/255,747 filed Jan. 23, 2019 which is a continuation of U.S. patent application Ser. No. 16/004,061, filed Jun. 8, 2018, now U.S. Pat. No. 10,283,552, which is a continuation of U.S. patent application Ser. No. 15/653,027, filed Jul. 18, 2017, now U.S. patent Ser. No. 10/026,772, which is a continuation of U.S. patent application Ser. No. 15/380,461, filed Dec. 15, 2016, now U.S. Pat. No. 9,741,760, which is a continuation of U.S. patent application Ser. No. 15/065,437, filed Mar. 9, 2016, now U.S. Pat. No. 9,564,467, which is a continuation of U.S. patent application Ser. No. 14/260,118, filed Apr. 23, 2014, now U.S. Pat. No. 9,337,230, which is a continuation of U.S. patent application Ser. No. 13/196,127, filed Aug. 2, 2011, now U.S. Pat. No. 8,749,679, which claims priority to Japanese Patent Application Serial No. JP 2010-179073, filed in the Japan Patent Office on Aug. 9, 2010, the entire disclosures of which are hereby incorporated herein by reference.

BACKGROUND

The present disclosure relates to a solid-state imaging device, a manufacturing method thereof, and an electronic apparatus, such as a camera, including a solid-state imaging device.

As a solid-state imaging device (image sensor), a CMOS solid-state imaging device has been widely spread. The CMOS solid-state imaging device is used, for example, for various personal digital assistances, such as a digital still camera, a digital video camera, and a mobile phone having a camera function.

The CMOS solid-state imaging device is formed of a plurality of pixels arranged in a two-dimensional matrix, each pixel unit having a photodiode which functions as a light receiving portion and a plurality of pixel transistors. The number of the pixel transistors is generally four, a transfer transistor, an amplification transistor, a reset transistor, and a selection transistor, or is three out of the above four other than the selection transistor. Alternatively, these pixel transistors may be shared by a plurality of photodiodes. In order to read out a signal current by applying a desired pulse voltage to these pixel transistors, terminals of the pixel transistors are connected through multilayer wires.

In a backside illuminated solid-state imaging device, a multilayer wiring layer containing layers of wires with at least one interlayer insulating film provided therebetween is disposed on a surface of a semiconductor substrate in which photodiodes and pixel transistors are formed, a support substrate is adhered to a multilayer wiring layer side, and the thickness of the semiconductor substrate is subsequently reduced. That is, the semiconductor substrate is polished from a rear surface side thereof to obtain a desired thickness. Next, a color filter and an on-chip lens are formed on a polished surface, so that a backside illuminated solid-state imaging device is formed.

In the backside illuminated solid-state imaging device, since the structure is formed so that light is incident on a photodiode from a rear surface side of the substrate, the numerical aperture is increased, and a solid-state imaging device having high sensitivity is realized.

In addition, in the solid-state imaging device, as an element isolation region for isolating pixels from each other, for example, there may be mentioned an element isolation region by an impurity diffusion layer, an element isolation region by a trench structure, or an element isolation region by a selective oxidation (local oxidation of silicon, LOCOS) layer. The impurity diffusion layer and the trench structure are suitably used for a microfabrication process as compared to the selective oxidation layer.

As documents relating to the CMOS solid-state imaging device, for example, Japanese Unexamined Patent Application Publication Nos. 2003-31785, 2005-302909, 2005-353955, and 2007-258684 may be mentioned. Japanese Unexamined Patent Application Publication No. 2003-31785 has disclosed a basic structure of a backside illuminated CMOS solid-state imaging device in which wires are formed at one surface side of a semiconductor substrate in which photodiodes are formed and in which visible light is allowed to be incident on the other surface side. Japanese Unexamined Patent Application Publication No. 2005-302909 has disclosed a shallow trench isolation (STI) structure used as an element isolation region of a CMOS solid-state imaging device. Japanese Unexamined Patent Application Publication No. 2005-353955 has disclosed the structure in which in a backside illuminated CMOS solid-state imaging device, a light-shielding layer is disposed at a rear surface side. Japanese Unexamined Patent Application Publication No. 2007-258684 has disclosed the structure in which in a backside illuminated CMOS solid-state imaging device, a film having a negative fixed charge is formed on a light receiving surface so as to suppress the generation of dark current at the interface. As the element isolation region of a solid-state imaging device, the structure formed by a trench, the inside of which is maintained hollow, has also been disclosed (see Japanese Unexamined Patent Application Publication No. 2004-228407).

SUMMARY

In a backside illuminated solid-state imaging device, since light is incident from a rear surface side of a semiconductor substrate in which photodiodes are formed, photoelectric conversion occurs most frequently at the rear surface side. Accordingly, it is important to suppress the occurrence of color mixture caused by leakage of charge (such as electron) photoelectrically converted in the vicinity of the rear surface side into an adjacent pixel.

By the way, when an element isolation region between adjacent photodiodes is formed by an impurity diffusion layer using ion implantation from a substrate surface side and an annealing treatment, an implanted impurity spreads more in a lateral direction at a deeper position at a rear surface side of the substrate due to scattering of high-energy ion implantation. For this reason, the electric field of a fine pixel in a lateral direction in the vicinity of the rear surface of the substrate is weak, and it is difficult to suppress the occurrence of color mixture caused by leakage of photoelectrically converted charge into an adjacent pixel.

Accordingly, there has been studied a method for forming an element isolation region by an impurity diffusion layer which is formed by implanting an impurity from a rear surface of a substrate by ion implantation, followed by performing laser annealing or the like to activate only an outermost surface of silicon so as not to damage multilayer wires formed beforehand. However, the suppression of thermal diffusion of the impurity and the recovery of crystal defects caused by ion implantation may not be easily achieved at the same time.

In addition, a method has also been studied in which an element isolation region which physically isolates pixels is formed by a trench formed in a rear surface of a substrate so as to suppress leakage of charge into an adjacent pixel. However, since heat is not allowed to be applied to multilayer wires formed beforehand as in the case described above, it is difficult to solve the causes of the generation of white spots and dark current by the trench formation. That is, there have been problems in that an inside wall of the trench may not be placed in a hole pinning state by a p-type impurity layer and the defects are not recovered by annealing or the like.

In addition, the leakage of charge into an adjacent pixel results in a decrease in sensitivity.

In consideration of the problems described above, it is desirable to provide a solid-state imaging device which suppresses the generation of white spots and dark current and the occurrence of color mixture and which improves the sensitivity and a method for manufacturing the solid-state imaging device.

In addition, it is also desirable to provide an electronic apparatus, such as a camera, including the solid-state imaging device described above.

According to an embodiment of the present disclosure, there is provided a solid-state imaging device which includes a pixel region in which pixels each having a photoelectric conversion portion and a plurality of pixel transistors are arranged in a two-dimensional matrix and an element isolation region isolating the pixels which is provided in the pixel region and which includes a semiconductor layer provided in a trench by an epitaxial growth. In addition, the above solid-state imaging device is formed as a backside illuminated type in which a light receiving surface is provided at a rear surface side of a semiconductor substrate opposite to a multilayer wiring layer.

In the solid-state imaging device described above, the semiconductor layer is filled in the trench by an epitaxial growth to form the element isolation region. Since being formed from an epitaxial growth layer, this semiconductor layer has no implantation defects caused by ion implantation and functions as a pinning layer having a charge opposite to a signal charge. Since the semiconductor layer is formed from an epitaxial growth layer, unlike the case of ion implantation, no impurities spread in a lateral direction even at a deep position in the substrate, the electric field strength at a rear surface of the substrate can be maintained high, and the isolation power of the element isolation region can be enhanced.

According to an embodiment of the present disclosure, there is provided a method for manufacturing a solid-state imaging device which includes: forming a trench having a predetermined depth in a semiconductor substrate from a surface thereof; and filling a semiconductor layer in the trench by an epitaxial growth to form an element isolation region. Subsequently, the method described above includes: forming pixels each having a photoelectric conversion portion and a plurality of pixel transistors in the semiconductor substrate to form a pixel region in which the pixels isolated by the element isolation region are arranged in a two-dimensional matrix; and forming a multilayer wiring layer on the surface of the semiconductor substrate in which a plurality of layers of wires is arranged with at least one interlayer insulating film provided therebetween. Next, the method described above also includes: adhering a support substrate on the multilayer wiring layer; and reducing the thickness of the semiconductor substrate so that the element isolation region is exposed to a rear surface of the semiconductor substrate and so that the rear surface thereof functions as a light-receiving surface.

In the method for manufacturing a solid-state imaging device according to an embodiment of the present disclosure, there are provided the steps of filling a semiconductor layer in a trench by an epitaxial growth to form an element isolation region and reducing the thickness of a semiconductor substrate so that the element isolation region is exposed to a rear surface of the semiconductor substrate and so that the rear surface thereof functions as a light-receiving surface. By the steps, the semiconductor layer in the trench has a pinning function on the charge opposite to a signal charge as described above, and an element isolation region having a high isolation power can be formed.

According to an embodiment of the present disclosure, there is provided an electronic apparatus which includes a solid-state imaging device, an optical system which guides incident light to a photoelectric conversion portion of the solid-state imaging device, and a signal processing circuit which processes an output signal of the solid-state imaging device. The solid-state imaging device includes a pixel region in which pixels each having a photoelectric conversion portion and a plurality of pixel transistors are arranged in a two-dimensional matrix and an element isolation region isolating the pixels which is provided in the pixel region and which includes a semiconductor layer provided in a trench by an epitaxial growth. Furthermore, the solid-state imaging device is formed as a backside illuminated type in which a light-receiving surface is provided at a rear surface side of a semiconductor substrate opposite to a multilayer wiring layer.

In the electronic apparatus described above, since the solid-state imaging device according to an embodiment of the present disclosure is used, in the element isolation region of the solid-state imaging device, a pinning function on the charge opposite to a signal charge and a high element isolation power are obtained.

In the solid-state imaging device according to an embodiment of the present disclosure, since the semiconductor layer in the trench by an epitaxial growth functions as a pinning layer, the generation of white spots and dark current in the element isolation region can be suppressed. Since the isolation power of the element isolation region is enhanced, the leakage of photoelectrically converted charge into an adjacent pixel can be prevented, the occurrence of color mixture can be suppressed, and the sensitivity can be improved.

By the method for manufacturing a solid-state imaging device according to an embodiment of the present disclosure, a solid-state imaging device which suppresses the generation of white spots and dark current and the occurrence of color mixture and which improves the sensitivity can be manufactured.

Since the electronic apparatus according to an embodiment of the present disclosure includes the solid-state imaging device according to an embodiment of the present disclosure, an electronic apparatus, such as a high definition camera, which suppresses the generation of white spots and dark current and the occurrence of color mixture and which improves the sensitivity can be provided.

DETAILED DESCRIPTION OF EMBODIMENTS

Hereinafter, the modes (which will be each referred to as "embodiment") for carrying out the present disclosure will be described. Description will be made in the following order.
1. Schematic structural example of a CMOS solid-state imaging device
2. First embodiment (a structural example of the solid-state imaging device and an example of a method for manufacturing the same)
3. Second embodiment (a structural example of the solid-state imaging device and an example of a method for manufacturing the same)
4. Third embodiment (a structural example of the solid-state imaging device and an example of a method for manufacturing the same)
5. Fourth embodiment (a structural example of the solid-state imaging device and an example of a method for manufacturing the same)
6. Fifth embodiment (a structural example of the solid-state imaging device and an example of a method for manufacturing the same)
7. Sixth embodiment (a structural example of the solid-state imaging device and an example of a method for manufacturing the same)
8. Seventh embodiment (a structural example of an electronic apparatus)

1. Schematic Structural Example of CMOS Solid-State Imaging Device

Figure 1:
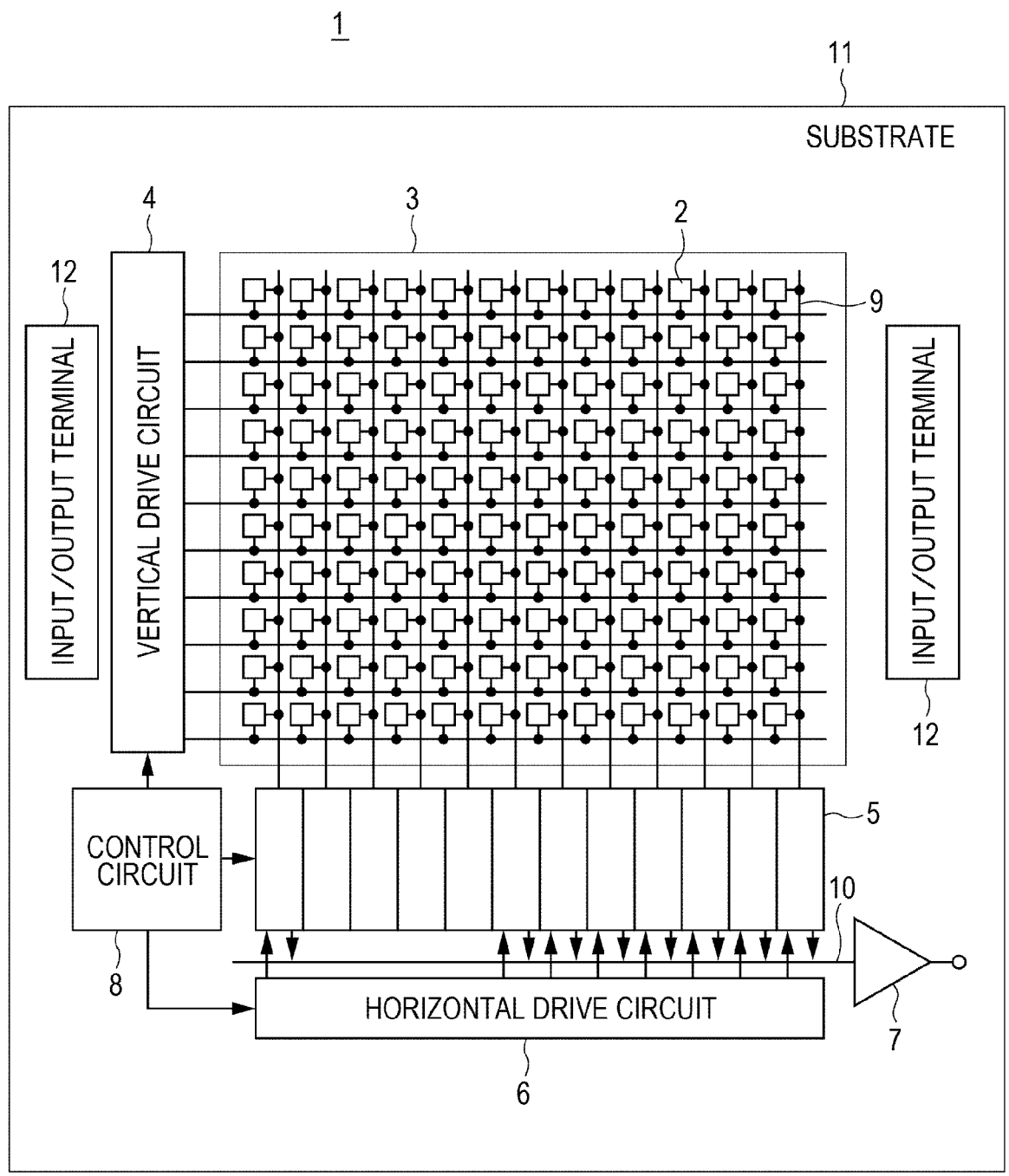
FIG. 1 is a schematic structural view showing one example of a solid-state imaging device applied to each embodiment of the present disclosure.

FIG. 1 shows a schematic structure of one example of a MOS solid-state imaging device applied to each embodiment of the present disclosure. As shown in FIG. 1, a solid-state imaging device 1 of this embodiment includes a pixel region (so-called imaging region) 3 in which a plurality of pixels 2 each having a photoelectric conversion portion is regularly arranged in a semiconductor substrate 11, such as a silicon substrate, in a two-dimensional matrix and a peripheral circuit portion. As the pixel 2, a unit pixel having one photoelectric conversion portion and a plurality of pixel transistors may be used. In addition, as the pixel 2, a so-called shared pixel structure (pixel structure having a floating diffusion and an amplification transistor shared by a plurality of photoelectric conversion regions) in which a plurality of photoelectric conversion portions shares the pixel transistors other than a transfer transistor may be used. The number of the pixel transistors may be four, a transfer transistor, an amplification transistor, a reset transistor, and a selection transistor, or may also be three out of the above four other than the selection transistor.

The peripheral circuit portion includes so-called logic circuits, such as a vertical drive circuit 4, a column signal processing circuit 5, a horizontal drive circuit 6, an output circuit 7, and a control circuit 8.

The control circuit 8 receives an input clock and data instructing an operational mode or the like and outputs data of internal information or the like of the solid-state imaging device. That is, in the control circuit 8, a clock signal and a control signal used as the basis of operations, for example, of the vertical drive circuit 4, the column signal processing circuit 5, and the horizontal drive circuit 6 are generated based on a vertical synchronizing signal, a horizontal synchronizing signal, and a master clock. In addition, these signals are input, for example, into the vertical drive circuit 4, the column signal processing circuit 5, and the horizontal drive circuit 6.

The vertical drive circuit 4 is formed, for example, of a shift register, selects a pixel drive wire, supplies a pulse for driving a pixel to the selected pixel drive wire, and drives pixels in units of rows. That is, the vertical drive circuit 4 sequentially selectively scans each of the pixels 2 of the pixel region 3 in units of rows in a vertical direction. In addition, the vertical drive circuit 4 supplies a column signal processing circuit 5, through a corresponding vertical signal line 9, with a pixel signal based on a signal charge generated in accordance with the amount of received light in a photoelectric conversion element, such as a photodiode, of each pixel 2.

The column signal processing circuit 5 is arranged, for example, for every column of the pixels 2 and performs signal processing, such as noise removal, for signals output from the pixels 2 of one row, for every pixel column. That is, the column signal processing circuit 5 performs signal-processing, such as CDS for removing fixed pattern noise specific to the pixel 2, signal amplification, and A-D conversion. A horizontal selecting switch (not shown) is connected between an output stage of the column signal processing circuit 5 and a horizontal signal line 10.

The horizontal drive circuit 6 is formed, for example, of a shift register, sequentially selects each column signal processing circuit 5 by sequentially outputting a horizontal scanning pulse, and allows each column signal processing circuit 5 to output a pixel signal to the horizontal signal line 10.

The output circuit 7 performs signal processing for signals sequentially supplied from the column signal processing circuits 5 through the horizontal signal line 10 and outputs processed signals. For example, the output circuit 7 may perform only buffering or may perform a black-level adjustment, column-variation correction, various types of digital signal processing, and the like. An input/output terminal 12 exchanges signals with the outside.

2. First Embodiment

[Structural Example of Solid-State Imaging Device]

Figure 2:
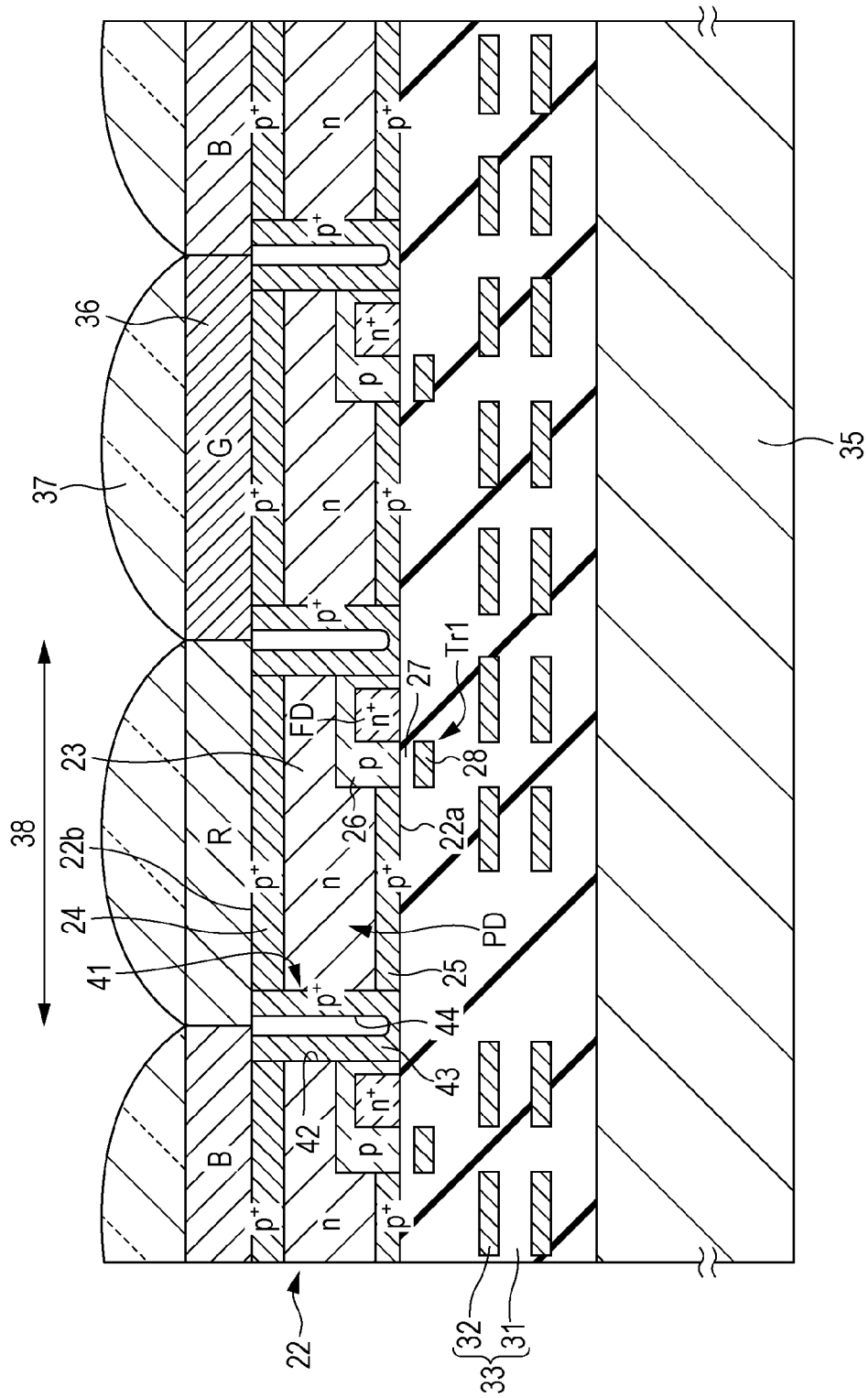
FIG. 2 is a schematic structural view showing a solid-state imaging device according to a first embodiment of the present disclosure.

A solid-state imaging device, a backside illuminated CMOS solid-state imaging device, according to a first embodiment of the present disclosure is shown in FIG. 2. A solid-state imaging device 21 according to the first embodiment has a pixel region in a silicon semiconductor substrate 22, the thickness of which is reduced, in which a plurality of unit pixels each having a photodiode PD functioning as a photoelectric conversion portion and a plurality of pixel transistors is regularly arranged in a two-dimensional matrix. The photodiode PD is formed, in the entire region of the semiconductor substrate 22 in a thickness direction, of a first conductivity type functioning as both photoelectric conversion and charge storage, i.e., an n-type charge storage region 23 in this embodiment, and second conductivity types functioning to suppress the generation of dark current at two interfaces of a front and a rear surface of the substrate, i.e., p-type semiconductor regions 25 and 24 in this embodiment. The photodiode PD is formed so as to extend under the pixel transistors. The pixel transistors are formed in a p-type semiconductor well region 26 formed at the side of a surface 22a of the semiconductor substrate 22. In the figure, as the pixel transistors, a transfer transistor Tr1 is representatively shown. The transfer transistor Tr1 is formed of the photodiode PD as a source, a floating diffusion FD formed of an n-type semiconductor region as a drain, and a transfer gate electrode 28 formed on a gate dielectric film 27 provided on the semiconductor substrate 22.

A multilayer wiring layer 33 in which a plurality of layers of wires 32 is arranged with at least one interlayer insulating film 31 provided therebetween is formed at a surface side of the semiconductor substrate 22, and a support substrate 35 is adhered to this multilayer wiring layer 33. The arrangement of the wires 32 is not particularly limited and may also be formed on the photodiode PD. A rear surface 22b of the semiconductor substrate 22 opposite to the multilayer wiring layer 33 functions as a light-receiving surface, and an insulating film, such as an anti-reflection film (not shown), a light-shielding layer (not shown) preventing light from being incident on an adjacent pixel, and the like are formed on this rear surface 22b of the substrate. Furthermore, a color filter 36 and an on-chip lens 37 are also formed. The photodiode PD is irradiated with light from a rear surface 22b side of the semiconductor substrate 22 through the on-chip lens 37.

In addition, in this embodiment, a trench 42 is formed in the semiconductor substrate 22, and a semiconductor layer 43 is filled in this trench 42 by an epitaxial growth, thereby forming an element isolation region 41 for isolating the pixels from each other. The semiconductor layer 43 is formed of a p-type semiconductor layer having a conductivity opposite to that of the n-type conductivity type 23 of the photodiode PD. The semiconductor layer 43 by an epitaxial growth is not fully filled in the trench to have a void 44 therein which extends in a depth direction and which is exposed to the rear surface 22b when the thickness of the semiconductor substrate 22 is reduced.

As shown by a manufacturing method which will be described later, after the p-type semiconductor layer 43 is formed in the trench 42 by an epitaxial growth to form the element isolation region 41, and activation of the p-type semiconductor layer 43 and recovery of damage done to the interface of the trench 42 are performed by annealing, the pixels and the multilayer wiring layer 33 are formed.

The n-type charge storage region 23 of the photodiode PD preferably has a concentration distribution such that the impurity concentration is high at the surface 22a side of the semiconductor substrate 22 and gradually decreases therefrom toward the rear surface 22b side. When the concentration distribution as described above is obtained, a charge photoelectrically converted in the vicinity of the rear surface 22b is likely to move toward the surface 22a side.

According to the solid-state imaging device 21 of the first embodiment, the element isolation region 41 is formed by filling the p-type semiconductor layer 43 in the trench 42 by an epitaxial growth. The p-type semiconductor layer 43 formed by an epitaxial growth has no implantation defects caused by ion implantation and is able to function as a hole pinning layer. In addition, since the trench 42 is processed by an annealing treatment before the multilayer wiring layer is formed, the etching damage to the trench 42 is recovered. As described above, in the element isolation region 41, since the trench 42 has no etching damage, and the p-type semiconductor layer 43 is formed as a pinning layer, the generation of white spots and dark current at the interface of the element isolation region 41 can be suppressed without any adverse influence of heat on the wires 32. In addition, since being formed by an epitaxial growth, the p-type semiconductor layer 43 does not spread in a lateral direction even at a deep position at the substrate side unlike the case of ion implantation, the uniform impurity concentration is maintained, and the electric field strength in the vicinity of the rear surface 22b can be maintained high. Accordingly, the isolation power of the element isolation region 41 can be enhanced, the leakage of a photoelectrically converted charge into an adjacent pixel can be prevented, and the occurrence of color mixture can also be suppressed.

Furthermore, in the element isolation region 41, since the void 44 extends in a depth direction and is exposed to the rear surface 22b, adjacent pixels are physically isolated from each other by this void 44. Therefore, the leakage of charge in the photodiode PD into an adjacent pixel can be substantially prevented. Since the charge is suppressed from leaking into an adjacent pixel at the rear surface 22b side, the occurrence of color mixture can be suppressed, and the sensitivity can be improved.

Since the void 44 is formed in the element isolation region 41, even if inclined incident light is incident thereon, the incident light is reflected at the interface between the void 44 and the p-type semiconductor layer 43 due to the difference in refractive index. Since the leakage of light into an adjacent pixel is prevented by this reflection, photoelectric conversion is not carried out in an adjacent pixel, and the occurrence of color mixture can be suppressed. In addition, since the incident light reflects at the interface between the void 44 and the p-type semiconductor layer 43 and enters the corresponding photodiode PD, the sensitivity can be improved.

In the n-type charge storage region 23 of the photodiode PD, when an impurity concentration distribution in which the impurity concentration is increased from the rear surface side to the surface side is formed, a charge photoelectrically converted in the vicinity of the rear surface moves to the surface side along the impurity concentration distribution and is stored. Hence, when the charge is read out, the charge transfer efficiency to the floating diffusion portion FD can be improved.

According to this embodiment, a backside illuminated solid-state imaging device can be provided which suppresses the occurrence of color mixture and which can obtain a high sensitive and quality image having a high dynamic range.

[Example of Manufacturing Method of Solid-State Imaging Device]

Figure 3A:
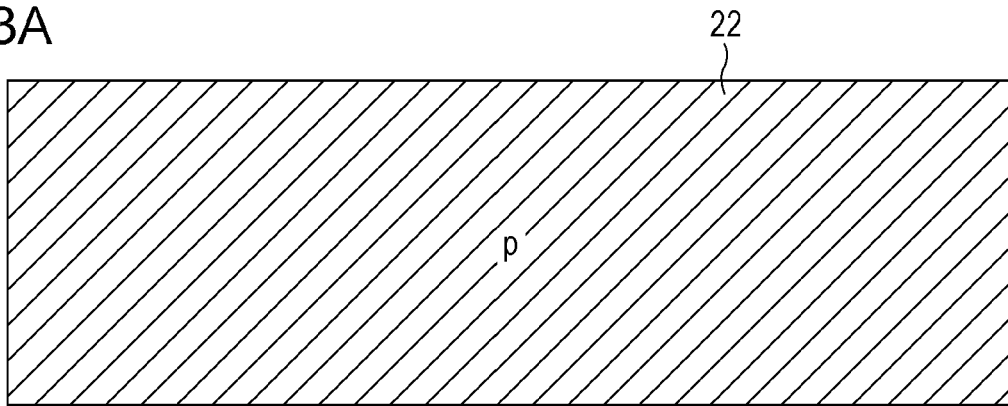
FIGS. 3A to 3C are cross-sectional views each showing one example of a method for manufacturing the solid-state imaging device according to the first embodiment (Part 1)

One example of a method for manufacturing the solid-state imaging device 21 according to the first embodiment will be described with reference to in FIGS. 3A to 6. First, in this example, the p-type silicon semiconductor substrate 22 is prepared as shown in FIG. 3A.

Figure 3B:
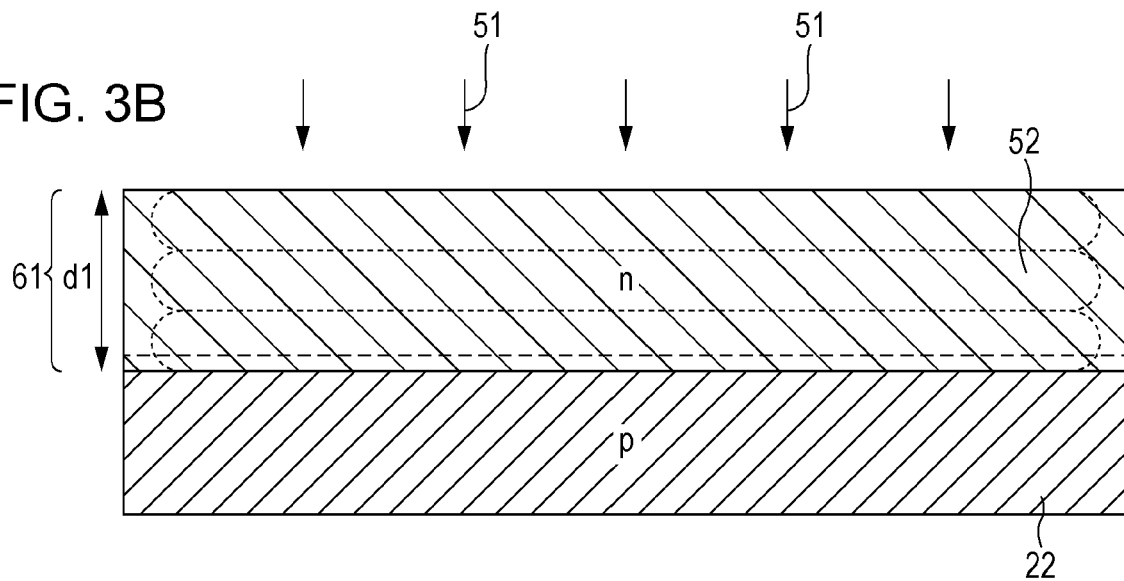

Next, as shown in FIG. 3B, an n-type impurity 51 is ion-implanted in the semiconductor substrate 22 from the surface 22a side, followed by performing an annealing treatment at a predetermined temperature, thereby forming an n-type semiconductor region 52 functioning as a charge storage region of a photodiode which is to be formed. This n-type semiconductor region 52 is preferably formed by performing ion implantation a plurality of times by changing the implantation energy and the dose to obtain an impurity concentration distribution by an annealing treatment so that the impurity concentration gradually decreases in a depth direction from the surface 22a. The n-type semiconductor region 52 is formed in a region corresponding to the pixel region. The n-type semiconductor region 52 is preferably formed deeper than the thickness of the semiconductor substrate 22, which is a thickness reduced in a subsequent step, that is, than a depth d1 of an active layer 61 in which the photodiode is to be formed.

Figure 3C:
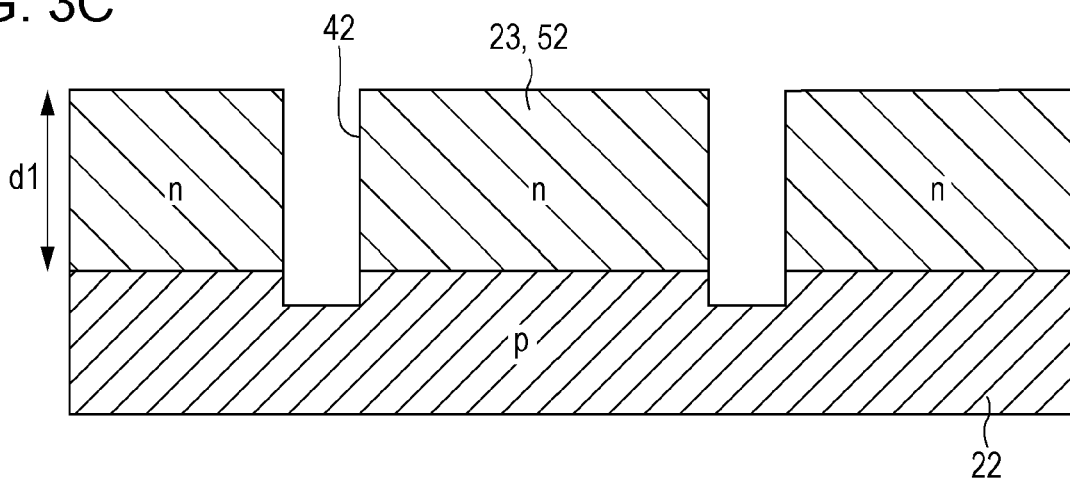

Next, as shown in FIG. 3C, the trench 42 is formed in the semiconductor substrate 22 deeper from the surface 22a than the depth d1 of the active layer 61 in which the photodiode is to be formed. This trench 42 is formed at a position corresponding to the element isolation region.

Figure 4D:
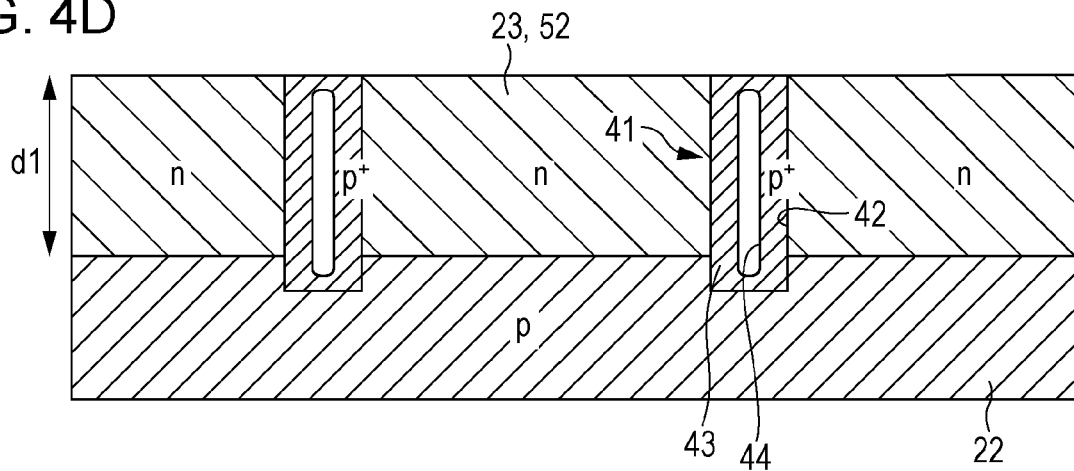
FIGS. 4D to 4F are cross-sectional views each showing one example of the method for manufacturing the solid-state imaging device according to the first embodiment (Part 2)

Next, as shown in FIG. 4D, the high-concentration p-type semiconductor layer 43 is filled in the trench 42 by an epitaxial growth to form the element isolation region 41. This p-type semiconductor layer 43 is epitaxially grown so as to form the void 44 therein which extends in a depth direction.

Figure 7A:
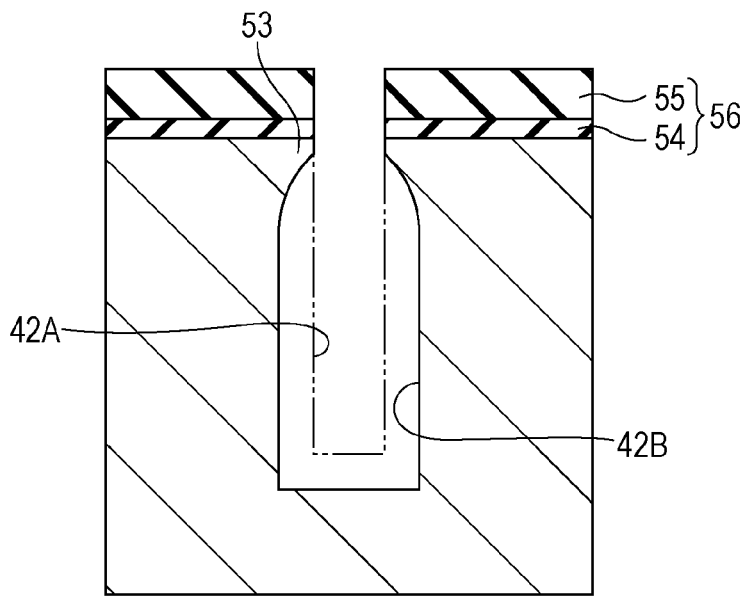
FIGS. 7A and 7B are cross-sectional views each showing one example in which a p-type semiconductor layer having a void therein is formed in a trench by an epitaxial growth.
Figure 7B:
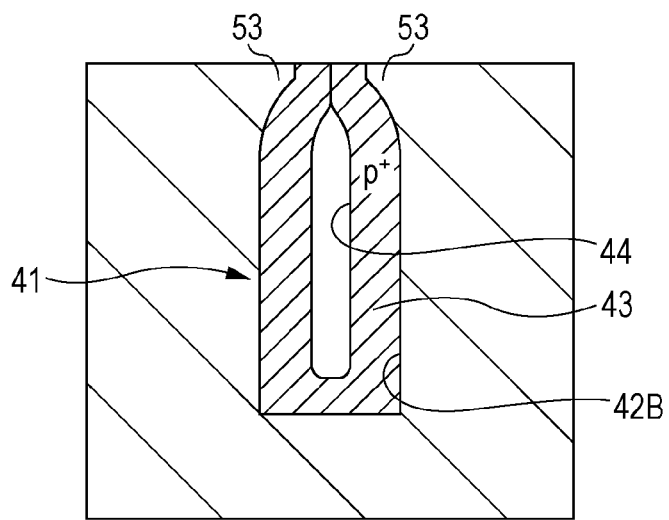

In order to fill the p-type semiconductor layer 43 having the void 44 in the trench 42 by an epitaxial growth, the following methods may be mentioned. For example, as shown in FIG. 7A, after a trench 42A (indicated by a chain line) is formed by anisotropic etching (dry etching), a laminate insulating film 56 of a silicon oxide film 54 and a silicon nitride film 55 is formed on the surface 22a, and the trench 42A is isotropically etched using the laminate insulating film 56 as a mask. By the isotropic etching, a trench 42B having an inclined wall portion 53 at each upper edge is formed. Next, when an epitaxial growth is performed from the inside surface of the trench 42B, as shown in FIG. 7B, the inclined wall portions 53 are closed, and the trench 42B will be filled with the p-type semiconductor layer 43 having the void 44 which extends in a depth direction.

Figure 8:
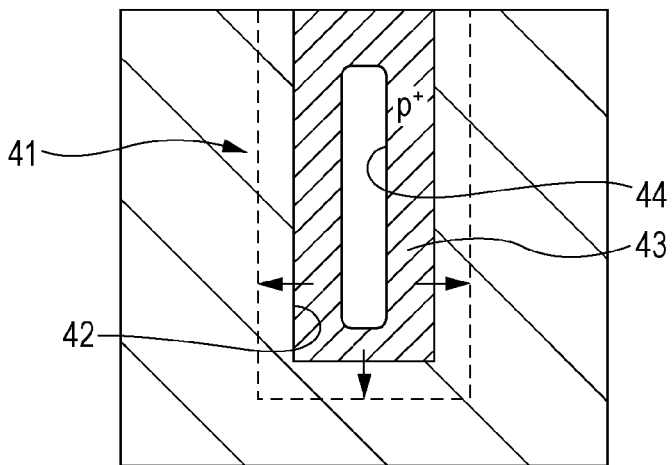
FIG. 8 is a schematic cross-sectional view illustrating a method for forming an element isolation region according to an embodiment of the present disclosure.

As another method, epitaxial growth conditions for forming the void 44 inside will be shown by way of example.
Substrate temperature: 750° C. to 850° C.
Pressure in chamber: 10 to 760 Torr
Flow rate of $SiH_2Cl_2$ (DCS): 10 to 100 sccm
Flow rate of HCl: 10 to 300 sccm
Flow rate of $H_2$: 10 to 50 slm
Flow rate of $B_2H_6$ (100 ppm/H2): 0.01 to 10 sccm Next, for example, an annealing treatment is performed at approximately 800° C. for activation of the p-type semiconductor layer 43 filled in the trench 42 and crystal recovery of the trench interface. This annealing treatment may also be performed by a heat treatment which is to be performed in a subsequent step. By the annealing treatment, as shown in FIG. 8, the p-type impurity of the filled p-type semiconductor layer 43 diffuses to a substrate 22 side, and the p-type semiconductor layer 43 substantially covers the trench interface, so that the influence of etching damage done to the trench 42 can be eliminated.

Figure 4E:
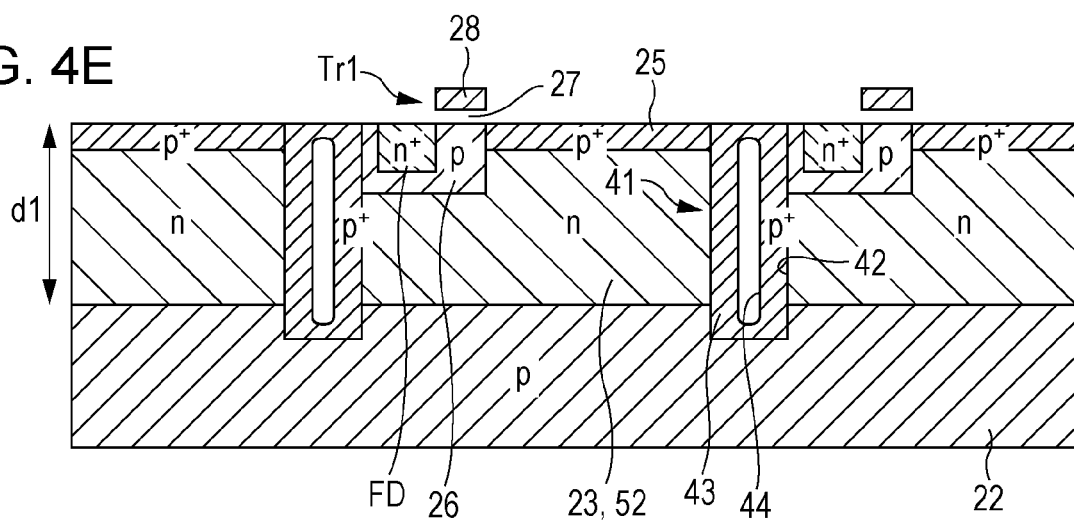

Next, as shown in FIG. 4E, the p-type semiconductor well region 26 is formed in a part of the n-type semiconductor region 52 at a surface side corresponding to each pixel isolated by the element isolation region 41. The p-type semiconductor region 25 is formed in the surface of the n-type charge storage region 23 which functions both as the photoelectric conversion and the charge storage and which is formed by the n-type semiconductor region 52 of each pixel, thereby forming the photodiode PD. The p-type semiconductor region 25 also functions as an accumulation layer for dark-current suppression. Furthermore, the floating diffusion portion FD is formed in the p-type semiconductor well region 26 by an n-type semiconductor region, and the transfer gate electrode 28 is formed on the gate dielectric film 27, so that the transfer transistor Tr1 is formed. When this transfer transistor Tr1 is formed, the other pixel transistors, such as a reset transistor Tr2, an amplification transistor Tr3, and a selection transistor Tr4, each having a pair of source/drain regions and a gate electrode, are simultaneously formed in the other part of the p-type semiconductor well region 26. As described above, the pixel region in which the pixels are arranged in a two-dimensional matrix is formed. Furthermore, the peripheral circuit portion (not shown) by CMOS transistors is formed in the periphery of the pixel region.

Figure 4F:
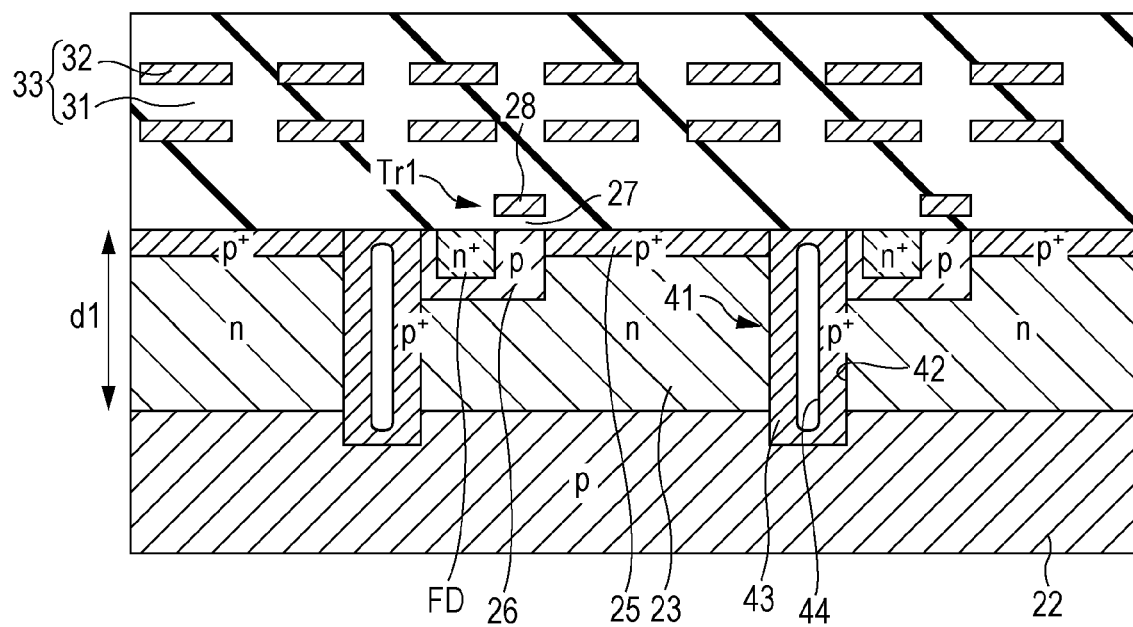

Next, as shown in FIG. 4F, the multilayer wiring layer 33 in which a plurality of layers of the wires 32 is disposed with at least one interlayer insulating film 31 provided therebetween is formed on the surface of the semiconductor substrate 22.

Figure 5G:
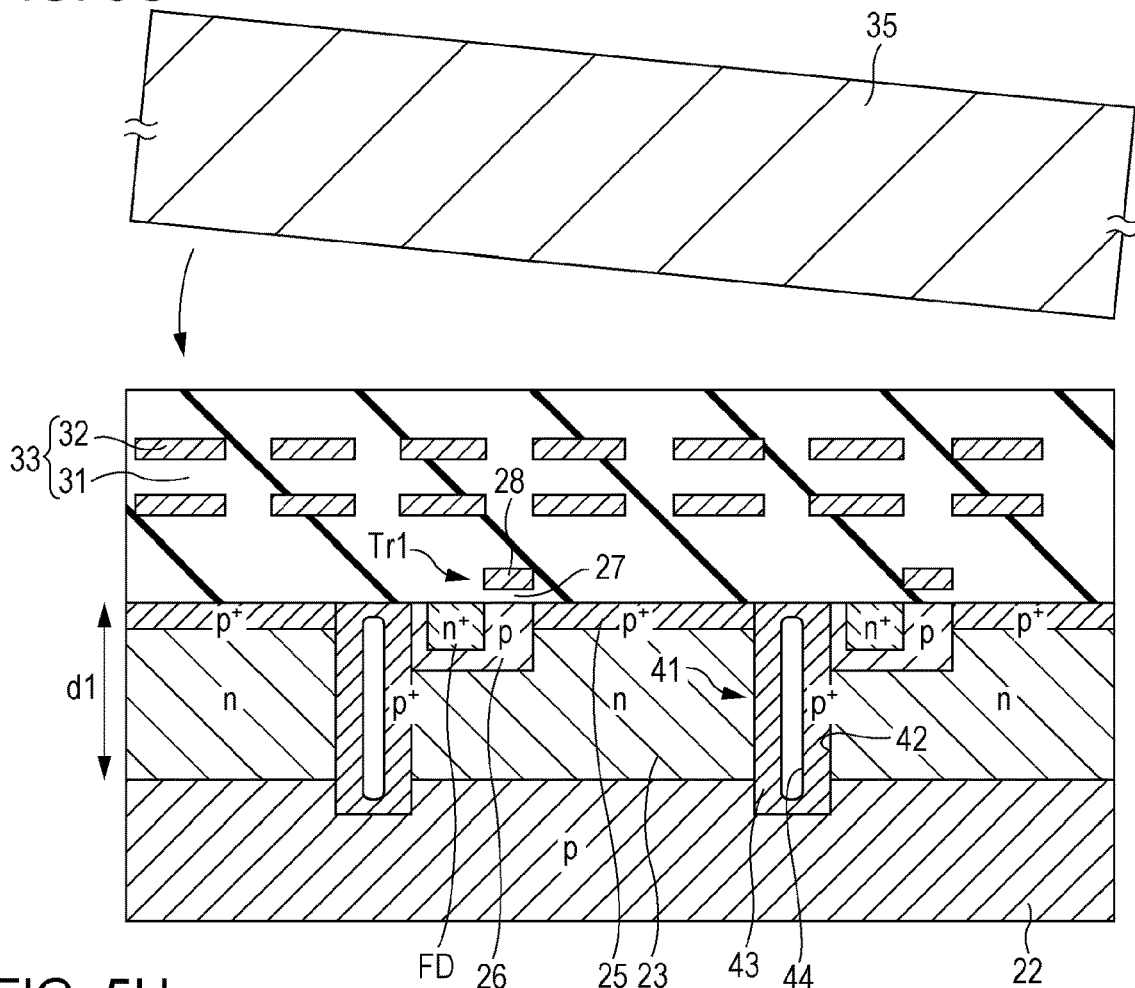
FIGS. 5G and 5H are cross-sectional views each showing one example of the method for manufacturing the solid-state imaging device according to the first embodiment (Part 3)

Next, as shown in FIG. 5G, the support substrate 35 formed, for example, of a silicon substrate is adhered on the multilayer wiring layer 33.

Figure 5H:
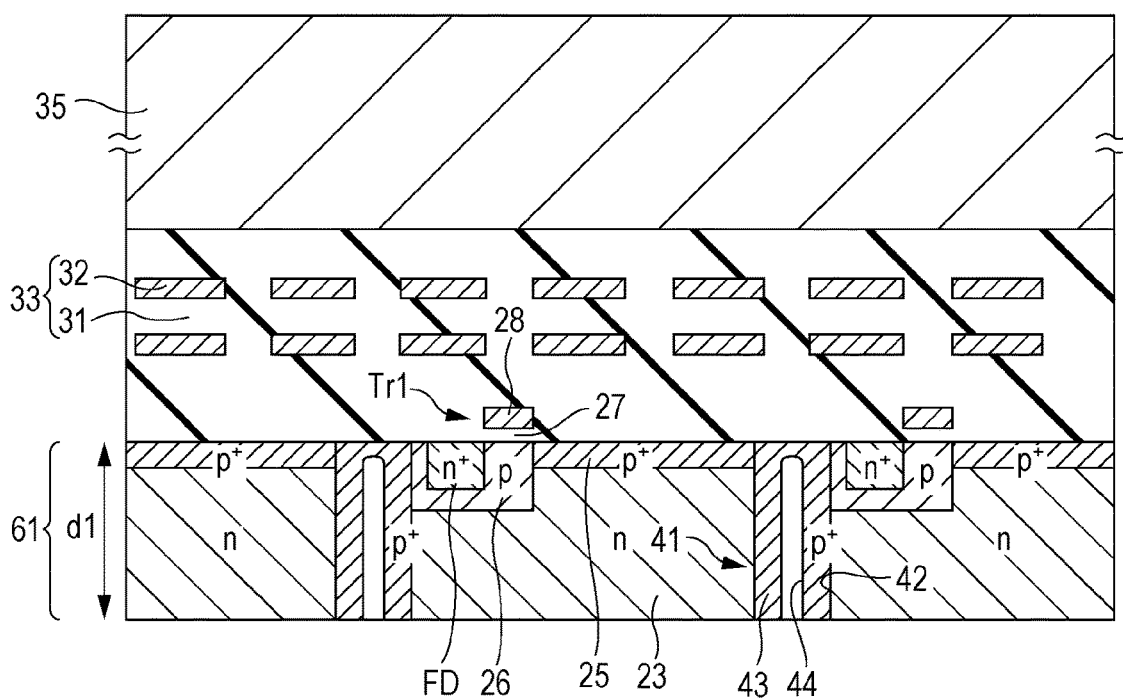

Next, as shown in FIG. 5H, the thickness of the semiconductor substrate 22 is reduced by grinding and polishing from the rear surface side thereof so that the active layer 61 having a thickness d1 is obtained. That is, the thickness of the semiconductor substrate 22 is reduced to the position of the active layer 61 so that the void 44 of the element isolation region 41 is exposed to the rear surface 22b of the semiconductor substrate 22.

Figure 6:
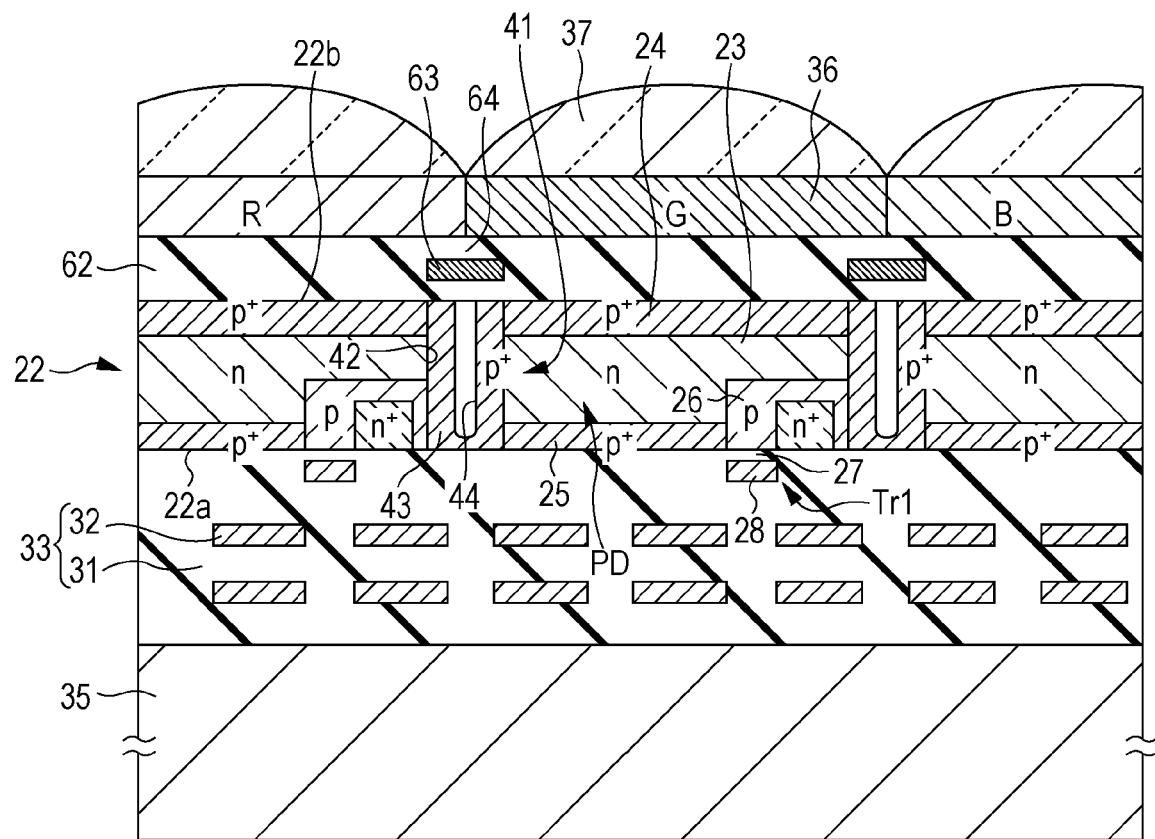
FIG. 6 is a cross-sectional view showing one example of the method for manufacturing the solid-state imaging device according to the first embodiment (Part 4)

Next, as shown in FIG. 6, the rear surface 22b of the semiconductor substrate 22, the thickness of which is reduced, is formed as a light-receiving surface, and the p-type semiconductor region 24 which forms the photodiode PD is formed in the rear surface 22b functioning as the light-receiving surface of the n-type charge storage region 23 of the photodiode PD. The p-type semiconductor region 24 also functions as an accumulation layer for dark-current suppression. A light-shielding layer 63 is formed above the rear surface 22b with an insulating film 62, such as an anti-reflection film, provided therebetween at a position at which light-shielding is to be performed, that is, at a position corresponding to the element isolation region 41 in the figure. Furthermore, the color filter 36 and the on-chip lens 37 are formed on a planarizing film 64 provided on the semiconductor substrate 22, so that the targeted solid-state imaging device 21 is obtained.

The method for manufacturing a solid-state imaging device according to this embodiment includes filling the p-type semiconductor layer 43 in the trench 42 by an epitaxial growth to form the element isolation region 41. Since the p-type semiconductor layer 43 is filled by an epitaxial growth, no ion implantation defects are generated, and hence the p-type semiconductor layer 43 is formed as an excellent hole pinning layer. Accordingly, the backside illuminated solid-state imaging device 21 can be manufactured which suppresses the generation of white spots and dark current and the occurrence of color mixture and which improves the sensitivity.

Since the p-type semiconductor layer 43 is formed by an epitaxial growth so as to have the void 44 inside, even if inclined incident light is incident thereon, the incident light is reflected at the interface between the p-type semiconductor layer 43 and the void 44 due to the difference in refractive index therebetween. Accordingly, the leakage of incident light into an adjacent pixel can be prevented, and the occurrence of color mixture can be suppressed. Since the thickness of the semiconductor substrate 22 is reduced so as to expose the void 44 to the rear surface 22b, the occurrence of color mixture can be further suppressed.

In the formation of the p-type semiconductor layer 43 in the trench 42, since the void 44 is allowed to be formed, the epitaxial growth can be performed in a lateral direction growth instead of in a bottom-up direction, and a time necessary for the epitaxial growth can be substantially reduced. Since the void 44 is exposed to the rear surface 22b, the variation in isolation performance caused by variation in depth and size of the void 44 and the variation in p-type impurity concentration at the lower side can be further prevented. In addition, when the void 44 is exposed at the rear surface 22b side, the degree of formation of the void 44 can be checked by measuring the line width of the void 44.

Since the trench 42 is formed by a surface process of the semiconductor substrate 22, and the void 44 is exposed by a rear surface process, lithographic misalignment between the element isolation region 41 and a light condensing structure, such as the on-chip lens, on the rear surface 22b can be suppressed. Since the trench 42 is filled back by an epitaxial growth of the p-type semiconductor layer 43 of silicon, even if a heat cycle is applied thereto, no internal stress is generated, and crystal defects caused by a stress concentrated to the corner of the trench 42 is not generated.

3. Second Embodiment

[Structural Example of Solid-State Imaging Device]

Figure 9A:
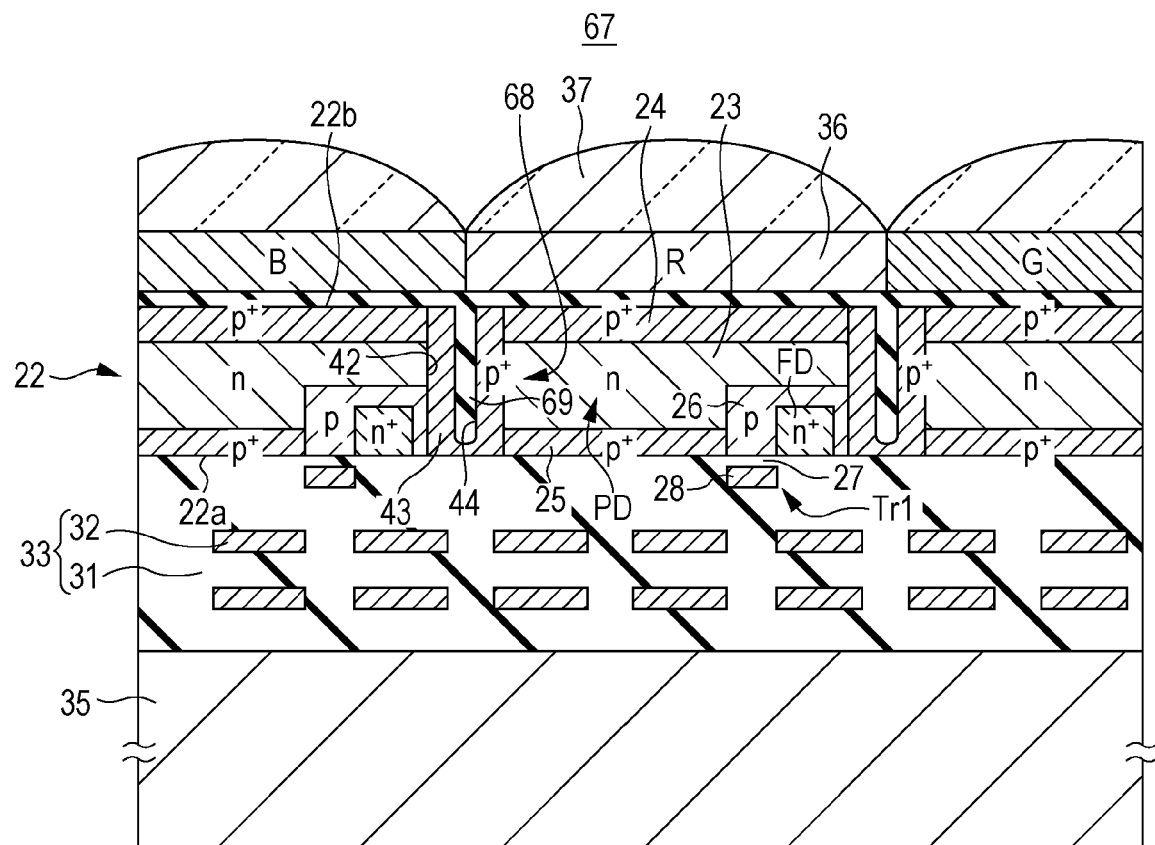
FIG. 9A is a schematic structural view showing an important section of a solid-state imaging device according to a second embodiment of the present disclosure.
Figure 9B:
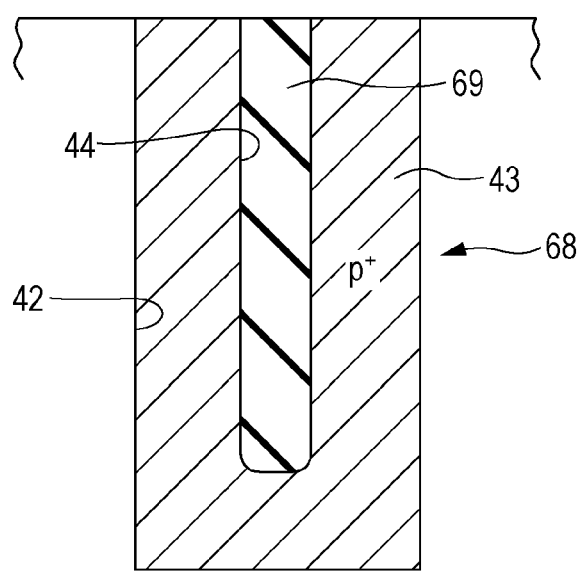
FIG. 9B is an enlarged cross-sectional view of an element isolation region shown in FIG. 9A.

A solid-state imaging device, a backside illuminated CMOS solid-state imaging device, according to a second embodiment of the present disclosure is shown in FIGS. 9A and 9B. In a solid-state imaging device 67 according to the second embodiment, an element isolation region 68 for isolating pixels is formed such that the p-type semiconductor layer 43 is provided in the trench 42 by an epitaxial growth, and an insulating film 69 is filled in the void 44 inside this p-type semiconductor layer 43. This insulating film 69 is filled so as not to form a void inside. As shown in FIG. 9A, the insulating film 69 can be formed over the entire surface containing the photodiode PD of the surface 22a as well as in the void 44. Alternatively, the insulating film 69 can be formed only in the void 44 as shown in FIG. 9B.

As the insulating film 69, an insulating film, such as a silicon oxide film or a silicon nitride film, may be used. In addition, as the insulating film 69, an insulating film having a negative fixed charge may also be used. As the insulating film having a negative fixed charge, for example, there may be used a film of hafnium dioxide ($HfO_2$), dialuminum trioxide ($Al_2O_3$), ditantalum pentaoxide ($Ta_2O_5$), dilanthanum trioxide ($La_2O_3$), or diyttrium trioxide ($Y_2O_3$). In addition, as the insulating film having a negative fixed charge, for example, oxide films of Zn, Pr, Nd, Pm, Sm, Eu, Gd, Tb, Dy, Ho, Er, Tm, Yb, Lu, Ti, and the like may also be used. As a method for forming the insulating film having a negative fixed charge, for example, an atomic layer deposition (ALD) method or a metal-organic chemical vapor deposition (MOCVD) method may be used. When the insulating film having a negative fixed charge is used, one type of film or a laminate containing a plurality of types of films may be used. For example, a laminate containing two types of films may be used as the insulating film having a negative fixed charge.

Since the other structure is similar to that described in the first embodiment, in FIGS. 9A and 9B, elements corresponding to those shown in FIG. 2 are designated by the same reference numerals as those described above, and a duplicated description will be omitted.

As one example of a method for manufacturing the solid-state imaging device 67 according to the second embodiment, after the above step of reducing the thickness of the semiconductor substrate shown in FIG. 5H, the insulating film 69 is formed so as to fill the inside of the void 44 exposed to the rear surface. A process including the step of reducing the thickness of the semiconductor substrate and the preceding steps and a process performed after the step of forming the insulating film 69 so as to fill the inside of the void 44 are similar to those of the method for manufacturing a solid-state imaging device according to the first embodiment described above (see FIGS. 3A to 5H and FIG. 6).

According to the solid-state imaging device 67 of the second embodiment, the p-type semiconductor layer 43 having the void 44 is formed in the trench 42, and the insulating film 69 is further filled in the void 44, so that the element isolation region 68 is formed. Since the insulating film 69 is filled in the void 44, adjacent pixels are further electrically insulated from each other, thereby suppressing the leakage of photoelectrically converted charge into an adjacent pixel. In addition, since the filled insulating film 69 has a refractive index different from that of the p-type semiconductor layer 43, even if inclined incident light is incident thereon, the light is not photoelectrically converted in an adjacent pixel after passing through the element isolation region 68. That is, inclined incident light is reflected at the interface between the silicon and the insulating film and does not leak outside from the pixel, and hence no color mixture occurs.

When the insulating film having a negative fixed charge is used as the insulating film 69, the hole pinning state by the p-type semiconductor layer 43 of the element isolation region 68 can be enhanced. In addition, when the insulating film having a negative fixed charge is formed to extend on the light-receiving surface of the photodiode PD as shown in FIG. 9A, the hole pinning state at the interface of the photodiode PD and the insulating film, that is, of the p-type semiconductor region 24, can be enhanced. Accordingly, the generation of white spots and dark current can be further suppressed.

In addition, in the solid-state imaging device 67 according to the second embodiment and the manufacturing method thereof, effects similar to those described in the first embodiment can be obtained.

4. Third Embodiment

[Structural Example of Solid-State Imaging Device]

Figure 10A:
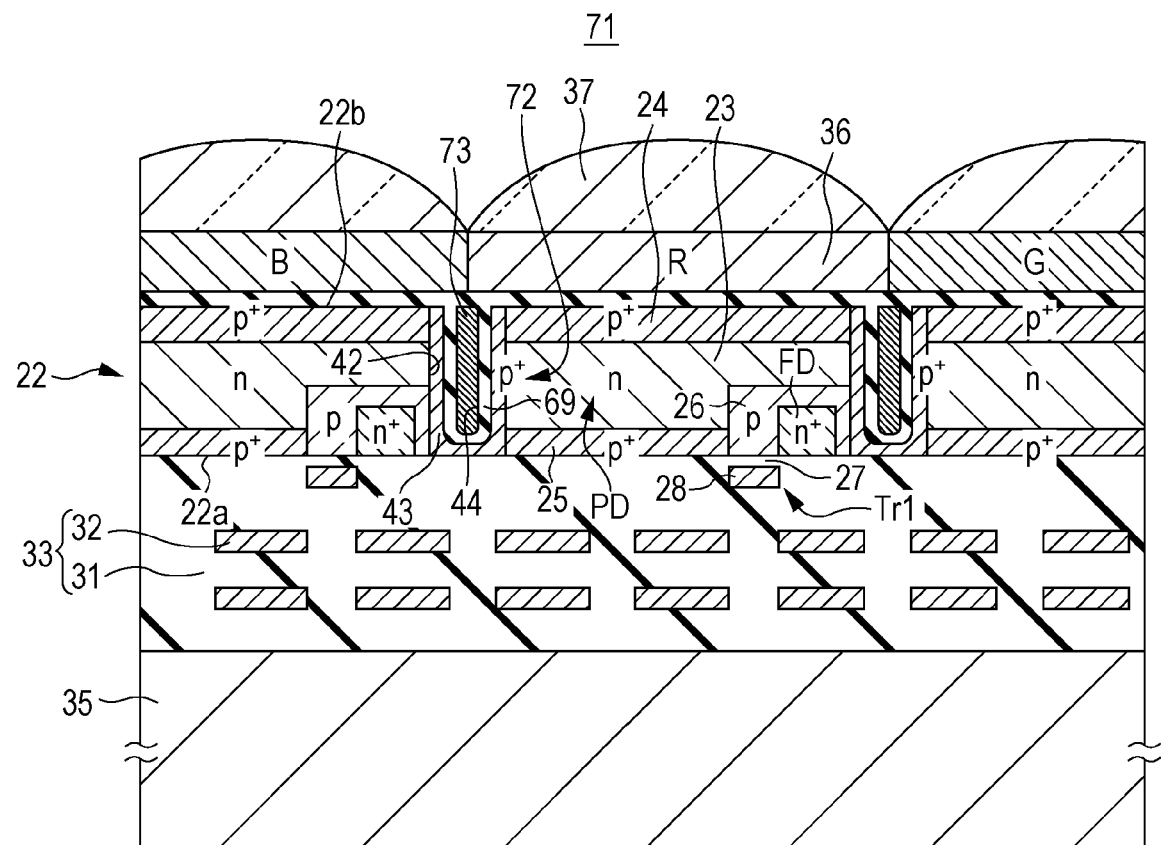
FIG. 10A is a schematic structural view showing an important section of a solid-state imaging device according to a third embodiment of the present disclosure.
Figure 10B:
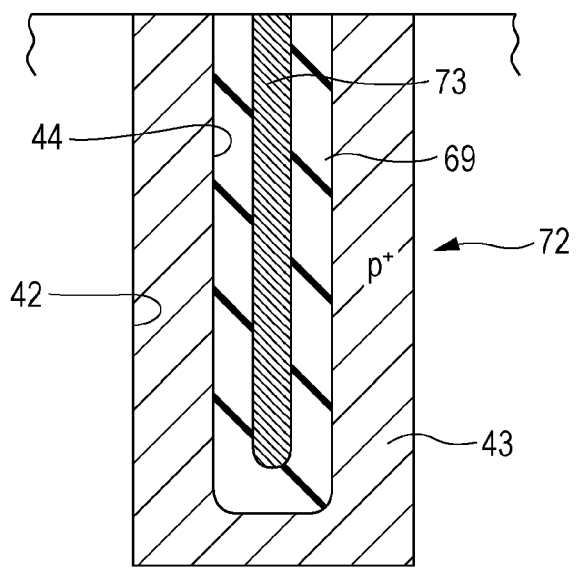
FIG. 10B is an enlarged cross-sectional view of an element isolation region shown in FIG. 10A.

A solid-state imaging device, a backside illuminated CMOS solid-state imaging device, according to a third embodiment of the present disclosure is shown in FIGS. 10A and 10B. A solid-state imaging device 71 according to the third embodiment is formed such that an element isolation region 72 isolating pixels has the p-type semiconductor layer 43 in the trench 42 by an epitaxial growth, and a light-shielding layer 73 is filled in the void 44 inside this p-type semiconductor layer 43 with the insulating film 69 provided therebetween. As the insulating film 69, as in the case described above, a silicon oxide film, a silicon nitride film, or a film having a negative fixed charge may be used. When the insulating film having a negative fixed charge is used, one type of film or a laminate containing a plurality of types of films may be used. This laminate film may be formed, for example, of two types of films. As shown in FIG. 10A, the insulating film 69 can be formed to extend over the entire surface containing the photodiode PD at the surface of the substrate as well as the inside of the void 44. Alternatively, the insulating film 69 can be formed only in the void 44 as shown in FIG. 10B.

A metal film can be used as the light-shielding layer 73. In addition, in the third embodiment, since the light-shielding layer 73 is provided in the element isolation region 72, the light-shielding layer 63 above the rear surface of the substrate shown in FIG. 6 may be omitted.

Since the other structure is similar to that described in the first embodiment, in FIGS. 10A and 10B, elements corresponding to those shown in FIG. 2 are designated by the same reference numerals as those described above, and a duplicated description will be omitted.

As one example of a method for manufacturing the solid-state imaging device 71 according to the third embodiment, after the above step of reducing the thickness of the semiconductor substrate shown in FIG. 5H, the insulating film 69 and the light-shielding layer 73 are formed so as to fill the inside of the void 44 which is exposed to the rear surface. A process including the step of reducing the thickness of the semiconductor substrate 22 and the preceding steps and a process performed after the step of forming the insulating film 69 and the light-shielding layer 73 so as to fill the inside of the void 44 are similar to those of the method for manufacturing a solid-state imaging device according to the first embodiment described above (see FIGS. 3A to 5H and FIG. 6). In addition, the formation of the light-shielding layer may also be omitted.

According to the solid-state imaging device of the third embodiment, the p-type semiconductor layer 43 having the void 44 is formed in the trench 42, and the light-shielding layer 73 is further filled in the void 44 with the insulating film 69 provided therebetween, so that the element isolation region 72 is formed. Since the light-shielding layer 73 is formed as a central core of the element isolation region 72, the leakage of charge into an adjacent pixel is further prevented by this light-shielding layer 73, or inclined incident light is prevented from entering an adjacent pixel by reflection at the light-shielding layer 73. Accordingly, since the isolation power of the element isolation region 72 is further enhanced, the occurrence of color mixture can be suppressed, and the sensitivity can be improved.

By the p-type semiconductor layer, the generation of white spots and dark current in the element isolation region 72 can be suppressed at the same time.

When the insulating film having a negative fixed charge is used as the insulating film 69, as in the case of the second embodiment, the hole pinning state can be further enhanced, and the generation of white spots and dark current can be further suppressed.

In addition, in the solid-state imaging device according to the third embodiment and the manufacturing method thereof, effects similar to those described in the first embodiment can be obtained.

5. Fourth Embodiment

[Structural Example of Solid-State Imaging Device]

Figure 11A:
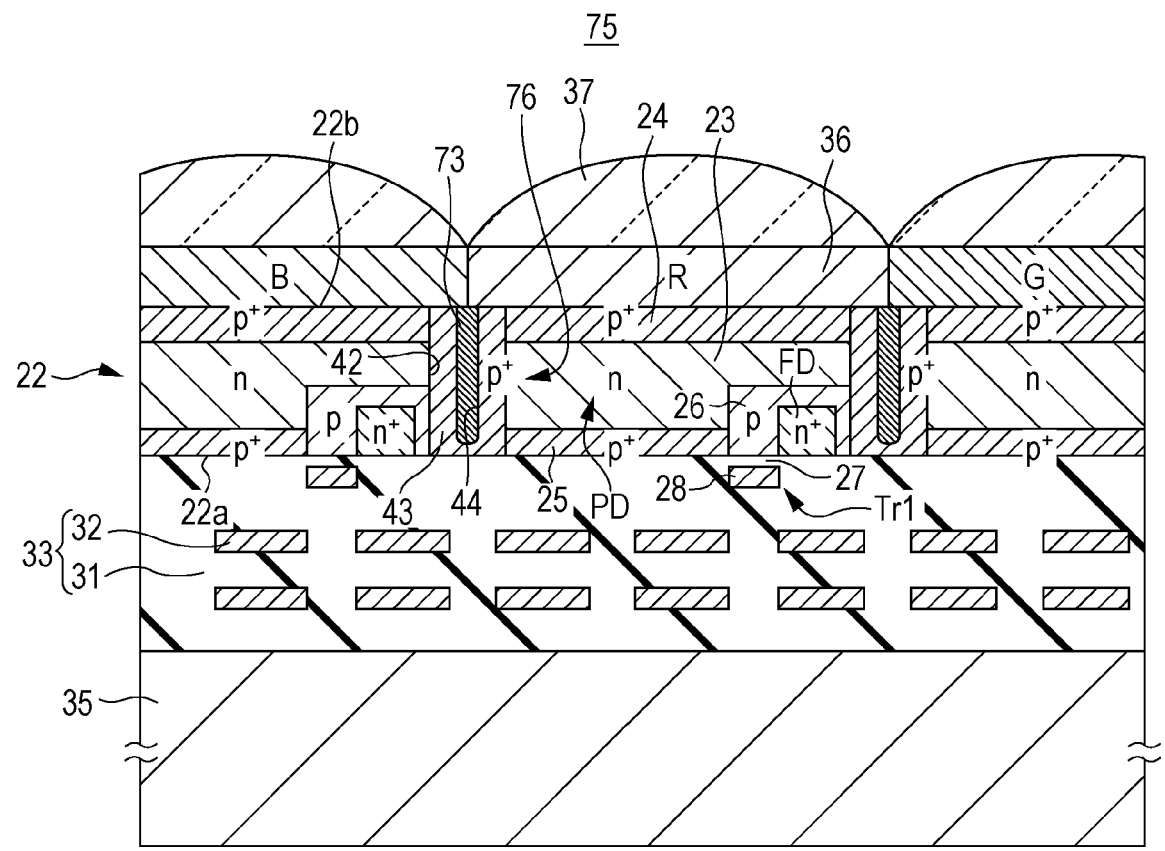
FIG. 11A is a schematic structural view showing an important section of a solid-state imaging device according to a fourth embodiment of the present disclosure.
Figure 11B:
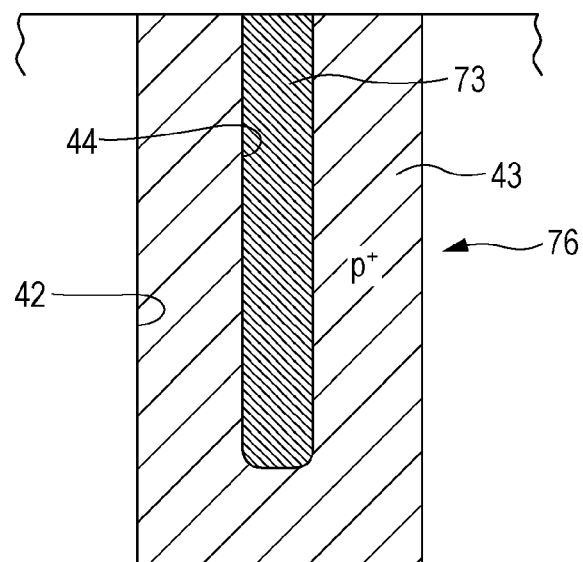
FIG. 11B is an enlarged cross-sectional view of an element isolation region shown in FIG. 11A.

A solid-state imaging device, a backside illuminated CMOS solid-state imaging device, according to a fourth embodiment of the present disclosure is shown in FIGS. 11A and 11B. A solid-state imaging device 75 according to the fourth embodiment is formed such that an element isolation region 76 for isolating pixels has the p-type semiconductor layer 43 in the trench 42 by an epitaxial growth, and the light-shielding layer 73 is filled in the void 44 of this p-type semiconductor layer 43. A metal film may be used as the light-shielding layer 73.

Since the other structure is similar to that described in the first embodiment, in FIGS. 11A and 11B, elements corresponding to those shown in FIG. 2 are designated by the same reference numerals as those described above, and a duplicated description will be omitted.

As one example of a method for manufacturing the solid-state imaging device 75 according to the fourth embodiment, after the above step of reducing the thickness of the semiconductor substrate shown in FIG. 5H, the light-shielding layer 73 is formed so as to fill the inside of the void 44 which is exposed to the rear surface. A process including the step of reducing the thickness of the semiconductor substrate 22 and the preceding steps and a process performed after the step of forming the light-shielding layer 73 so as to fill the void 44 are similar to those of the method for manufacturing a solid-state imaging device according to the first embodiment described above (see FIGS. 3A to 5H and FIG. 6).

According to the solid-state imaging device 75 of the fourth embodiment, the p-type semiconductor layer 43 having the void 44 is formed in the trench 42, and the light-shielding layer 73 is further filled in the void 44, so that the element isolation region 76 is formed. The leakage of charge into an adjacent pixel is further prevented by this light-shielding layer 73, or inclined incident light is prevented from entering an adjacent pixel by reflection at the light-shielding layer. Accordingly, since the isolation power of the element isolation region 76 is further enhanced, the occurrence of color mixture can be suppressed, and the sensitivity can be improved.

By the p-type semiconductor layer 43, the generation of white spots and dark current in the element isolation region 76 can be suppressed at the same time.

In addition, in the solid-state imaging device according to the fourth embodiment and the manufacturing method thereof, effects similar to those described in the first embodiment can be obtained.

6. Fifth Embodiment

[Structural Example of Solid-State Imaging Device]

Figures 12A, 12B:
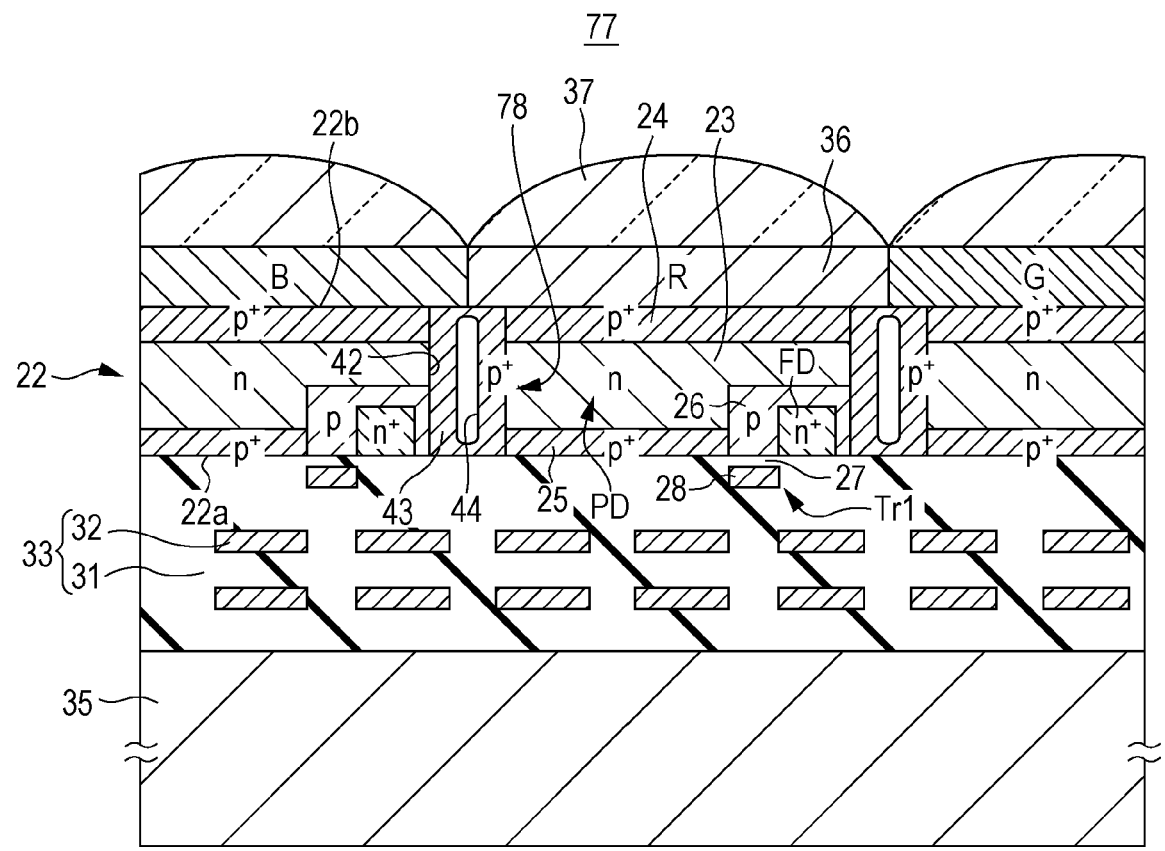
FIG. 12A is a schematic structural view showing an important section of a solid-state imaging device according to a fifth embodiment of the present disclosure.
FIG. 12B is an enlarged cross-sectional view of an element isolation region shown in FIG. 12A.

A solid-state imaging device, a backside illuminated CMOS solid-state imaging device, according to a fifth embodiment of the present disclosure is shown in FIGS. 12A and 12B. A solid-state imaging device 77 according to the fifth embodiment is formed such that an element isolation region 78 for isolating pixels has the p-type semiconductor layer 43 in the trench 42 by an epitaxial growth, and the void 44 is formed inside this p-type semiconductor layer 43. At this time, the void 44 is formed to be confined in the p-type semiconductor layer 43 and not to be exposed to the rear surface 22b when the thickness of the semiconductor substrate 22 is reduced.

Since the other structure is similar to that described in the first embodiment, in FIGS. 12A and 12B, elements corresponding to those shown in FIG. 2 are designated by the same reference numerals as those described above, and a duplicated description will be omitted.

As one example of a method for manufacturing the solid-state imaging device 77 according to the fifth embodiment, in the above step of reducing the thickness of the semiconductor substrate 22 shown in FIG. 5H, the reduction in thickness is stopped at a position at which the void 44 is not exposed to the rear surface 22b. The preceding steps before the thickness of the semiconductor substrate 22 is reduced are the same as those shown in FIG. 3A to FIG. 5G, and the steps performed after the thickness of the semiconductor substrate is reduced so that the void 44 is not exposed are the same as those shown in FIG. 6.

According to the solid-state imaging device 77 of the fifth embodiment, the p-type semiconductor layer 43 having the void 44 is formed in the trench 42, and the element isolation region 78 is formed so that the void 44 is confined in the p-type semiconductor layer 43 without being exposed. In the element isolation region 78 as described above, as in the case of the first embodiment, adjacent pixels are also physically isolated from each other by this void 44. Hence, since the leakage of charge into an adjacent pixel is prevented, and the isolation power of the element isolation region 78 is further enhanced, the occurrence of color mixture can be suppressed, and the sensitivity can be improved.

By the p-type semiconductor layer 43, the generation of white spots and dark current in the element isolation region 78 can be suppressed at the same time.

In addition, in the solid-state imaging device according to the fifth embodiment and the manufacturing method thereof, effects similar to those described in the first embodiment can be obtained.

7. Sixth Embodiment

[Structural Example of Solid-State Imaging Device]

Figure 13:
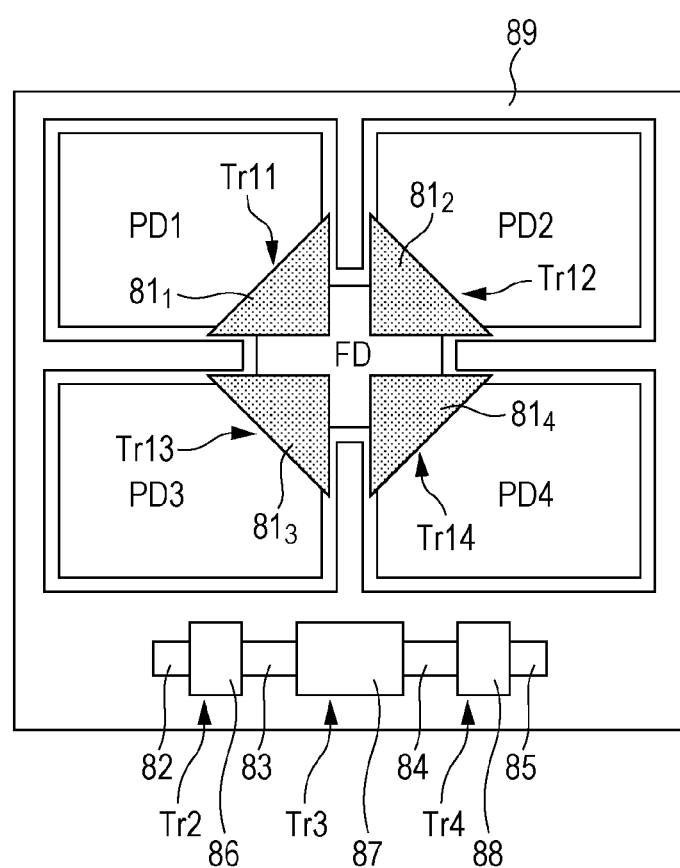
FIG. 13 is a schematic structural view of an important section of a solid-state imaging device according to a sixth embodiment of the present disclosure.

A solid-state imaging device, a backside illuminated CMOS solid-state imaging device, according to a sixth embodiment of the present disclosure is shown in FIG. 13. This embodiment relates to a so-called shared pixel solid-state imaging device in which a plurality of photodiodes shares the pixel transistors other than the transfer transistor. In this embodiment, a 4-shared pixel solid-state imaging device will be described.

In a solid-state imaging device 80 according to the sixth embodiment, photodiodes PD (PD1 to PD4) of total four pixels, 2 pixels in a row and 2 pixels in a row, form a single sharing unit (so-called 4-shared pixel unit), and a plurality of the single sharing units is arranged in a two-dimensional array, thereby forming the pixel region. In the single sharing unit, one floating diffusion portion FD is shared by the four photodiodes PD (PD1 to PD4). In addition, as the pixel transistors, there are four transfer transistors Tr1 (Tr1$_1$ to Tr1$_4$), a reset transistor Tr2, an amplification transistor Tr3, and a selection transistor Tr4, and among these, the transistors Tr2 to Tr4 are shared. Since an equivalent circuit of this 4-shared pixel structure is common to the public, a description thereof will be omitted.

The floating diffusion portion FD is arranged at the center among the four photodiodes PD1 to PD4. The transfer transistors Tr1$_1$ to Tr1$_4$ have the common floating diffusion portion FD and respective transfer gate electrodes 81 (81$_1$ to 81$_4$) arranged between this floating diffusion portion FD and the respective photodiodes PD.

The reset transistor Tr2, the amplification transistor Tr3, and the selection transistor Tr4, shared by the four pixels, are formed in a transistor formation region under a so-called photo diode formation region in which the photodiodes PD1 to PD4 are formed.

The reset transistor Tr2 is formed of a pair of source/drain regions 82 and 83 and a reset gate electrode 86. The amplification transistor Tr3 is formed of a pair of source/drain regions 83 and 84 and an amplification gate electrode 87. The selection transistor Tr4 is formed of a pair of source/drain regions 84 and 85 and a selection gate electrode 88. The common floating diffusion portion FD is connected to the amplification gate electrode 87 of the amplification transistor Tr3 and one of the source/drain regions 82 of the reset transistor Tr2 through wires (not shown).

An element isolation region 89 surrounding the photodiodes PD1 to PD4 and the common pixel transistors Tr2 to Tr4 is formed by one of the element isolation regions 41, 68, 72, and 76 described in the first to the fourth embodiments.

As one example of a method for manufacturing the solid-state imaging device 80 according to the sixth embodiment, a method in accordance with one of the manufacturing methods described in the first to the fourth embodiments may be used.

According to the 4-shared pixel solid-state imaging device 80 of the sixth embodiment, in the backside illuminated device, since the element isolation region 89 is formed by one of the element isolation regions 41, 68, 72, 76, and 77, the generation of white spots and dark current and the occurrence of color mixture can be suppressed, and the sensitivity can be improved. In addition, effects similar to those described in the first to the fourth embodiments are obtained.

Although the above solid-state imaging device according to each of the embodiments is formed such that electrons are used as signal charges, an n-type conductivity is used as the first conductivity, and a p-type conductivity is used as the second conductivity, the present disclosure may also be applied to a solid-state imaging device which uses holes as signal charges. In this case, an n-type conductivity is used as the second conductivity, and a p-type conductivity is used as the first conductivity.

8. Seventh Embodiment

[Structural Example of Electronic Apparatus]

The solid-state imaging device according to any one of the embodiments of the present disclosure is applicable to electronic apparatuses including a camera system, such as a digital camera or a video camera, a cellular phone having an imaging function, and another apparatus having an imaging function.

Figure 14:
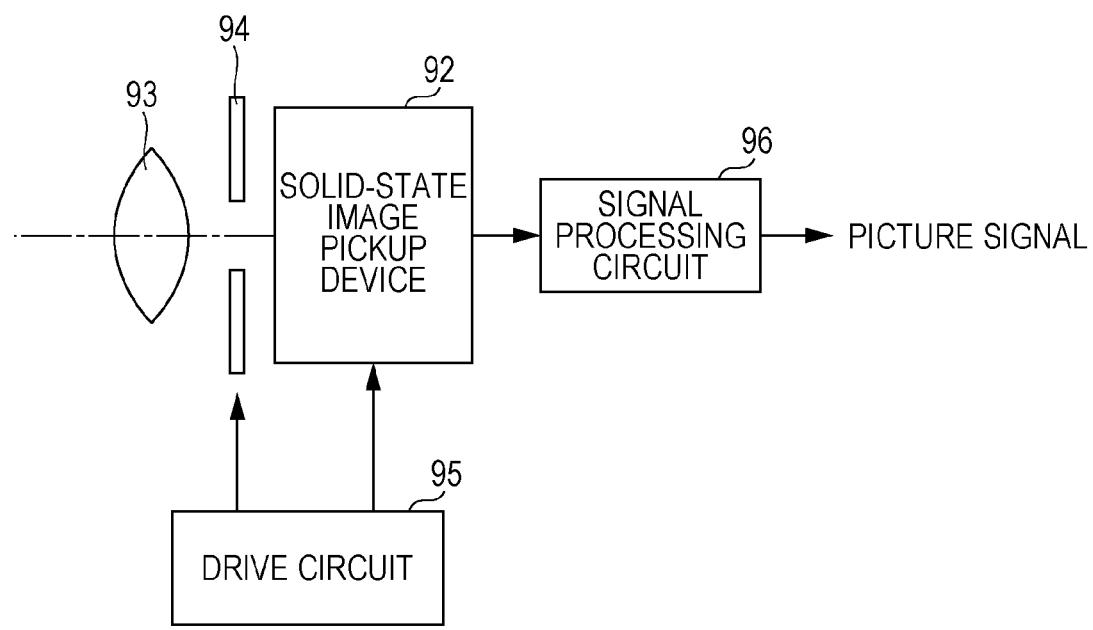
FIG. 14 is a schematic structural view of an electronic apparatus according to a seventh embodiment of the present disclosure.

As one example of an electronic apparatus according to a seventh embodiment of the present disclosure, a camera is shown in FIG. 14. The camera according to this embodiment is, for example, a video camera capable of taking a still image or an animation. A camera 91 of this embodiment includes a solid-state imaging device 92, an optical system 93 which guides incident light to a light-receiving sensor portion of the solid-state imaging device 92, a shutter device 94, a drive circuit 95 which drives the solid-state imaging device 92, and a signal processing circuit 96 which processes an output signal of the solid-state imaging device 92.

One of the solid-state imaging devices of the above embodiments is applied to the solid-state imaging device 92. The optical system (optical lens) 93 enables image light (incident light) from an object to form an image on an imaging surface of the solid-state imaging device 92. Accordingly, signal charges are stored for a certain period of time in the solid-state imaging device 92. The optical system 93 may be an optical lens system having a plurality of optical lenses. The shutter device 94 controls a light irradiation period and a light shielding period for the solid-state imaging device 92. The drive circuit 95 supplies a drive signal which controls a transfer operation of the solid-state imaging device 92 and a shutter operation of the shutter device 94. By the drive signal (timing signal) supplied from the drive circuit 95, the solid-state imaging device 92 performs signal transfer. The signal processing circuit 96 performs various types of signal processings. An image signal processed by signal processing is stored in a storage medium, such as a memory, or is output to a monitor.

According to the electronic apparatus of the seventh embodiment, in the backside illuminated solid-state imaging device 92, the generation of white spots and dark current and the occurrence of color mixture can be suppressed, and the sensitivity can be improved. According to this embodiment, an electronic apparatus can be provided which suppresses the occurrence of color mixture and which can obtain a high sensitive and quality image having a high dynamic range. For example, a camera having improved image quality can be provided.

It should be understood by those skilled in the art that various modifications, combinations, sub-combinations and alterations may occur depending on design requirements and other factors insofar as they are within the scope of the appended claims or the equivalents thereof.

What is claimed is:

1. A light detecting device, comprising:
a semiconductor substrate including a first plane receiving incident light and a second plane opposite to the first plane;
a first photoelectric conversion region disposed in the semiconductor substrate;
a second photoelectric conversion region disposed the semiconductor substrate adjacent to the first photoelectric conversion region;
a first trench disposed between the first and second photoelectric conversion regions;
a first void region disposed in the first trench, wherein the first void region is not disposed at the first plane of the semiconductor substrate in a cross-sectional view; and
a multi wiring layer disposed on the second plane of the semiconductor substrate.

2. The light detecting device according to claim 1, wherein the semiconductor substrate includes a p-type region, and wherein the p-type region is disposed between the first void region and the first photoelectric conversion region in the cross-sectional view.

3. The light detecting device according to claim 1, wherein the first void region is not extended over a first side of the semiconductor substrate.

4. The light detecting device according to claim 1, further comprising a third photoelectric conversion region disposed adjacent to the second photoelectric conversion region.

5. The light detecting device according to claim 4, further comprising a second trench including a second void region.

6. The light detecting device according to claim 4, further comprising a fourth photoelectric conversion region disposed adjacent to the third photoelectric conversion region.

7. The light detecting device according to claim 6, wherein the first, the second, the third, and the fourth photoelectric conversion regions share a reset transistor, an amplification transistor, and a selection transistor.

8. The light detecting device according to claim 1, further comprising a reset transistor, an amplification transistor, and a selection transistor.

9. An electronic apparatus, comprising:
an optical system; and
a light detecting device, comprising:
a semiconductor substrate including a first plane receiving incident light and a second plane opposite to the first plane;
a first photoelectric conversion region disposed in the semiconductor substrate;
a second photoelectric conversion region disposed the semiconductor substrate adjacent to the first photoelectric conversion region;
a first trench disposed between the first and second photoelectric conversion regions;
a first void region disposed in the first trench, wherein the first void region is not disposed at the first plane of the semiconductor substrate in a cross-sectional view; and
a multi wiring layer disposed on the second plane of the semiconductor substrate.

10. The electronic apparatus according to claim 9, wherein the semiconductor substrate includes a p-type region, and wherein the p-type region is disposed between the first void region and the first photoelectric conversion region in the cross-sectional view.

11. The electronic apparatus according to claim 9, wherein the first void region is not extended over a first side of the semiconductor substrate.

12. The electronic apparatus according to claim 9, further comprising a third photoelectric conversion region disposed adjacent to the second photoelectric conversion region.

13. The electronic apparatus according to claim 12, further comprising a second trench including a second void region.

14. The electronic apparatus according to claim 12, further comprising a fourth photoelectric conversion region disposed adjacent to the third photoelectric conversion region.

15. The electronic apparatus according to claim 14, wherein the first, the second, the third, and the fourth photoelectric conversion regions share a reset transistor, an amplification transistor, and a selection transistor.

16. The electronic apparatus according to claim 9, further comprising a reset transistor, an amplification transistor, and a selection transistor.

* * * * *